United States Patent
Lei et al.

(10) Patent No.: US 12,490,558 B2
(45) Date of Patent: Dec. 2, 2025

(54) ARRAY SUBSTRATE AND DISPLAY DEVICE FOR MINI-LED

(71) Applicants: Hefei Xinsheng Optoelectronics Technology Co., Ltd., Anhui (CN); BOE TECHNOLOGY GROUP CO., LTD., Beijing (CN)

(72) Inventors: Jie Lei, Beijing (CN); Zouming Xu, Beijing (CN); Jian Tian, Beijing (CN); Chunjian Liu, Beijing (CN); Xintao Wu, Beijing (CN); Jie Wang, Beijing (CN); Qin Zeng, Beijing (CN); Jianying Zhang, Beijing (CN); Zhi Zhang, Beijing (CN); Qingpu Wang, Beijing (CN); Chuanwen Zhang, Beijing (CN); Zhenzhong Fang, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 501 days.

(21) Appl. No.: 17/517,640

(22) Filed: Nov. 2, 2021

(65) Prior Publication Data
US 2022/0238771 A1 Jul. 28, 2022

Related U.S. Application Data

(63) Continuation-in-part of application No. PCT/CN2021/074256, filed on Jan. 28, 2021.

(51) Int. Cl.
*H10H 20/857* (2025.01)
*H01L 21/66* (2006.01)

(52) U.S. Cl.
CPC .......... *H10H 20/857* (2025.01); *H01L 22/32* (2013.01)

(58) Field of Classification Search
None
See application file for complete search history.

(56) References Cited

U.S. PATENT DOCUMENTS 9,735,119 B1 * 8/2017 Lee .................. H01L 24/03
9,960,196 B2    5/2018 Zhang et al.
(Continued)

FOREIGN PATENT DOCUMENTS

| CN | 105789251 A | 7/2016 |
| CN | 105974690 A | 9/2016 |

(Continued)

OTHER PUBLICATIONS

The Written Opinion of the International Searching Authority of International Application No. PCT/CN2021/074256 dated Nov. 4, 2021, (4p).

(Continued)

*Primary Examiner* — Sue A Purvis
*Assistant Examiner* — Seyon Ali-Simah Punchbeddell
(74) *Attorney, Agent, or Firm* — Arch & Lake LLP

(57) ABSTRACT

The present disclosure provides an array substrate and a display device. The array substrate includes a base substrate, a first conductive layer and a second conductive layer, the first conductive layer is provided on one side of the base substrate and includes a first conductive portion; the second conductive layer is provided on one side of the first conductive layer away from the base substrate and includes a second conductive portion; the projection of at least part of the second conductive portion on the base substrate and the projection of the first conductive portion on the base substrate do not overlap.

18 Claims, 10 Drawing Sheets

(56) References Cited

U.S. PATENT DOCUMENTS

| | | | |
|---|---|---|---|
| 2013/0201434 A1* | 8/2013 | Murata | G02F 1/1395 349/141 |
| 2018/0012948 A1* | 1/2018 | Lee | H10K 59/1213 |
| 2018/0265057 A1 | 9/2018 | Hasegawa | |
| 2018/0307067 A1* | 10/2018 | Hwang | G02F 1/133345 |
| 2020/0013686 A1 | 1/2020 | Kao et al. | |
| 2021/0305351 A1* | 9/2021 | Cho | H10K 50/80 |
| 2021/0376209 A1* | 12/2021 | Wang | H01L 25/167 |
| 2022/0037448 A1* | 2/2022 | Ma | H10K 59/1216 |

FOREIGN PATENT DOCUMENTS

| | | | | |
|---|---|---|---|---|
| CN | 107742636 A | 2/2018 | | |
| CN | 108417682 A | 8/2018 | | |
| CN | 108877653 A | 11/2018 | | |
| CN | 109285856 A | 1/2019 | | |
| CN | 105789251 B | 3/2019 | | |
| CN | 209912874 U | 1/2020 | | |
| CN | 107742636 B | 4/2020 | | |
| CN | 110972495 A | 4/2020 | | |
| CN | 111149225 A | 5/2020 | | |
| CN | 111540764 A | 8/2020 | | |
| CN | 111627350 A | 9/2020 | | |
| CN | 111952323 A | 11/2020 | | |
| IN | 111508991 A | 8/2020 | | |
| KR | 2009009614 A | * | 1/2009 | G02F 1/136227 |
| WO | 2020013427 A1 | 1/2020 | | |
| WO | 2020227861 A1 | 11/2020 | | |
| WO | 2021023107 A1 | 2/2021 | | |
| WO | 2021120075 A1 | 6/2021 | | |

OTHER PUBLICATIONS

The First DE Office Action issued in Application No. 112021003516.9 with a mailing date of Jul. 17, 2024, (16p).

* cited by examiner

ARRAY SUBSTRATE AND DISPLAY DEVICE FOR MINI-LED

CROSS REFERENCE

This application is based upon and claims priority to International Application No. PCT/CN2021/074256, filed on Jan. 28, 2021, the entire content thereof is incorporated herein by reference for all purposes.

TECHNICAL FIELD

The present disclosure relates to the technical field of display, and in particular, to an array substrate and a display device.

BACKGROUND

Mini-LED is a new type of LED display technology derived from small-pitch LEDs, also known as sub-millimeter light-emitting diodes. The grain dimension of the Mini-LED is about 100 to 200 μm, that is, between that of the traditional LED and Micro LED. Because of its good display effect and thin and light experience, as well as its advantages such as higher contrast and long life, so it as an obvious trend of use in the high-end display field.

SUMMARY

According to the first aspect of the present disclosure, an array substrate is provided, the array substrate includes:
  A base substrate;
  A first conductive layer, provided on one side of the base substrate and comprising a first conductive portion;
  A second conductive layer, provided on one side of the first conductive layer away from the base substrate and comprising a second conductive portion;
  A projection of at least part of the second conductive portion on the base substrate and a projection of the first conductive portion on the base substrate do not overlap.

In an exemplary embodiment of the present disclosure, the first conductive portion is provided with an opening area, a projection of at least part of the second conductive portion on the base substrate is located in an area enclosed by a projection of the opening area.

In an exemplary embodiment of the present disclosure, there is a gap between a projection edge of a portion of the second conductive portion corresponding to the opening area and a projection edge of the opening area.

In an exemplary embodiment of the present disclosure, the second conductive portion includes any one of a pad, a first lead, a second lead and a functional unit;
  The opening area includes any one of a first opening area, a second opening area, a third opening area and a fourth opening area.

In an exemplary embodiment of the present disclosure, the opening area includes the first opening area, the first opening area includes a plurality of first sub-opening areas;
  The second conductive portion includes a plurality of groups of pads, each group of pads includes a plurality of sub-pads;
  At least part of projections of the sub-pads on the base substrate are located in areas enclosed by projections of the first sub-opening areas in a one-to-one correspondence, and there is a gap between an outer periphery of a projection of each of the sub-pads and a projection edge of a corresponding first sub-opening area.

In an exemplary embodiment of the present disclosure, the first sub-opening areas corresponding to the sub-pads of the same group of the pads are connected to each other.

In an exemplary embodiment of the present disclosure, at least part of the first conductive portion is configured to extend along a first direction, the opening area includes a second opening area, and the second opening area includes at least one second sub-opening area;
  The second conductive portion includes a first lead extending along the first direction;
  At least part of a projection of the first lead on the base substrate overlaps an area enclosed by a projection of the second sub-opening area, and there is a gap between a projection edge of at least one side of the first lead and a projection edge of the second sub-opening area.

In an exemplary embodiment of the present disclosure, there are a plurality of second sub-opening areas, and at least two of the second sub-opening areas are connected with each other.

In an exemplary embodiment of the present disclosure, at least part of the first conductive portion is configured to extend along a first direction, the opening area includes a third opening area, and the third opening area includes at least one third sub-opening area;
  The second conductive portion includes a second lead extending along a second direction; the second direction is intersected the first direction;
  At least part of a projection of the second lead on the base substrate overlaps an area enclosed by a projection of the third sub-opening area, and there is a gap between edges on opposite sides of the second lead and a projection edge of the third sub-opening area.

In an exemplary embodiment of the present disclosure, there are a plurality of third sub-opening areas, and at least two of the third sub-opening areas are connected to each other.

In an exemplary embodiment of the present disclosure, the opening area includes the fourth opening area, the fourth opening area includes at least one fourth sub-opening area;
  The second conductive portion includes several functional units;
  A projection of each of the functional units on the base substrate is located in an area enclosed by a projection of each the fourth sub-opening area in a one-to-one correspondence, and there is a gap between an outer periphery of a projection of each of the functional units and a projection edge of a corresponding fourth sub-opening area.

In an exemplary embodiment of the present disclosure, there are a plurality of fourth sub-opening areas, and at least two of the fourth sub-opening areas are connected to each other.

In an exemplary embodiment of the present disclosure, each of the functional units includes a first test conductive portion electrically connected to the pad, the first lead or the second lead, the first test conductive portion is used to test electrical properties of the pad, the first lead or the second lead.

In an exemplary embodiment of the present disclosure, at least two of the first opening area, the second opening area, the third opening area, and the fourth opening area are connected to each other.

In an exemplary embodiment of the present disclosure, the gap between the projection edge of the second conductive portion and the projection edge of a corresponding opening area is greater than or equal to a preset value, the preset value includes a sum of a process tolerance, a maximum dimension of impurities, and a reserved spacing;

The process tolerance is referred to an allowable dimensional deviation in a fabricating process of the first conductive portion and/or the second conductive portion, the maximum dimension of impurities is referred to a maximum diameter of impurity particles in the fabricating process, the reserved spacing is referred to a spacing value artificially set in order to form the gap.

In an exemplary embodiment of the present disclosure, the preset value is 20 μm.

In an exemplary embodiment of the present disclosure, the first conductive layer further includes a plurality of conductive islands, and at least one of the sub-opening areas is provided with the conductive islands, and there is a gap between an outer periphery of a conductive island and an edge of a corresponding sub-opening area;

A projection of at least one of the sub-pad, the first lead, the second lead and the first test conductive portion on the base substrate is located within a projection of a corresponding conductive island or completely overlaps with the projection of the corresponding conductive island.

In an exemplary embodiment of the present disclosure, the gap between the outer periphery of the conductive island and the edge of the corresponding sub-opening area is greater than or equal to a preset value, the preset value comprises a sum of a process tolerance, a maximum dimension of impurities, and a reserved spacing.

In an exemplary embodiment of the present disclosure, the preset value is 20 μm.

In an exemplary embodiment of the present disclosure, a material of the conductive island is same as a material of the first conductive portion.

In an exemplary embodiment of the present disclosure, at least two of the sub-opening areas of one same opening area are connected to each other, and the conductive islands in the sub-opening areas connected to each other are independent of each other or connected as a whole.

In an exemplary embodiment of the present disclosure, at least two of the first opening area, the second opening area, the third opening area, and the fourth opening area are connected to each other, the conductive islands in opening areas connected with each other are independent of each other or connected as a whole.

In an exemplary embodiment of the present disclosure, the second conductive layer further includes a second test conductive portion, a projection of the second test conductive portion on the base substrate overlaps a projection of the first conductive portion on the base substrate, and the second test conductive portion and the first conductive portion are electrically connected through a via hole, the second test conductive portion is used to detect an electrical performance of the first conductive portion.

According to another aspect of the present disclosure, a display device is provided, which includes an array substrate described above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, and show embodiments in accordance with the disclosure, and together with the specification are used to explain the principle of the disclosure. Obviously, the drawings in the following description are only some embodiments of the present disclosure, for those of ordinary skill in the art, other drawings can be obtained based on these drawings without creative work.

DETAILED DESCRIPTION

Figure 1:
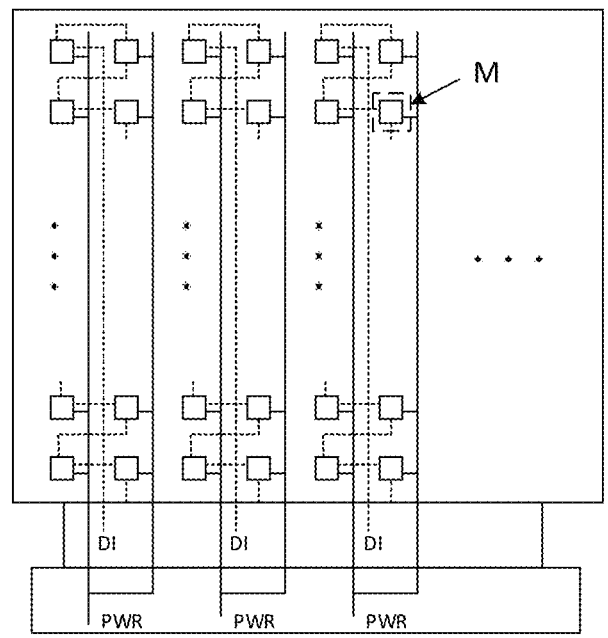
FIG. 1 is a schematic structural diagram of an array substrate of a mini LED.

Exemplary embodiments will now be described more fully with reference to the accompanying drawings. However, the exemplary embodiments can be implemented in various forms, and should not be construed as being limited to the embodiments set forth herein. On the contrary, these embodiments are provided so that this disclosure will be comprehensive and complete, and will fully convey the concept of exemplary embodiments to those skilled in the art. The same reference numerals in the drawings indicate the same or similar structures, and thus their detailed descriptions will be omitted. In addition, the drawings are only schematic illustrations of the present disclosure, and are not necessarily drawn to scale.

Exemplary embodiments will now be described more fully with reference to the accompanying drawings. However, the exemplary embodiments can be implemented in various forms, and should not be construed as being limited to the embodiments set forth herein. On the contrary, these embodiments are provided so that this disclosure will be comprehensive and complete, and will fully convey the concept of exemplary embodiments to those skilled in the art. The same reference numerals in the drawings indicate the same or similar structures, and thus their detailed descriptions will be omitted.

In the drawings, the regions and the thickness of layers may be exaggerated for clarity. The same reference numerals in the drawings represent the same or similar structures, and thus their detailed descriptions will be omitted.

The described features, structures or characteristics may be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, materials, etc. can be used. In other cases, well-known structures, materials, or operations are not shown or described in detail to avoid obscuring the main technical ideas of the present disclosure.

When a structure is "on" other structure(s), it may mean that a certain structure is integrally formed on other structure(s), or that a certain structure is "directly" installed on other structure(s), or that a certain structure is "indirectly" installed on other structure(s) through another structure.

The terms "one", "a" and "the" are used to indicate that there are one or more elements/components/etc.; the terms "include/comprise" and "have" are used to mean open-ended inclusion and mean that there may be additional elements/components/etc. in addition to the listed elements/components/etc. The terms "first" and "second" are only used as markers and are not a limitation on the number of objects.

Figure 2:
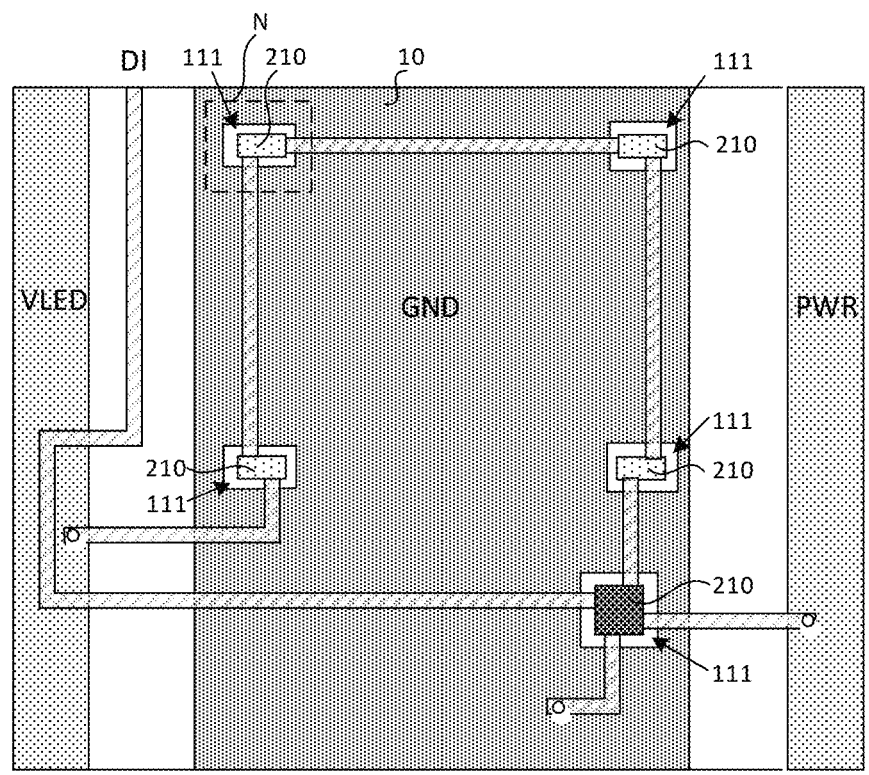
FIG. 2 is a partial enlarged view of region M in FIG. 1.

As shown in FIG. 1 which is a schematic structural diagram of an array substrate of a mini LED. FIG. 2 is a partial enlarged view of region M in FIG. 1 and shows a structure of a light-emitting unit. The light-emitting unit includes four light-emitting devices connected in series, the light-emitting device electrically connected to the driving voltage line VLED is used as the starting point of the four light-emitting devices in series, and the light-emitting device electrically connected to the driver IC is used as the end point of the four light-emitting devices in series. The four light-emitting devices are driven by a driver IC.

It should be noted that, in the embodiments of the present disclosure, the number of the light-emitting devices in each light-emitting unit is not limited, and can be any number such as five, six, seven, eight, etc., and is not limited to four. At the same time, the light-emitting device can be a Mini-LED, OLED or any other light-emitting device.

In the embodiment of the present disclosure, the Mini-LED array substrate includes a base substrate 900, a first conductive layer 100, and a second conductive layer 200. The first conductive layer 100 is provided on one side of the base substrate 900 and includes a first conductive portion 10. The second conductive layer 200 is provided on the side of the first conductive layer 100 away from the base substrate 900 and includes a second conductive portion 20. A first insulating layer 400 and a first inorganic layer 300 are provided between the first conductive layer 100 and the second conductive layer 200, and a second insulating layer 600 and a second inorganic layer 500 are provided on the second conductive layer 200. The insulating layer can be multi-layered layers in the form of inorganic-organic-inorganic, which has a better waterproof oxygen effect. If the organic layer needs to be particularly thick, it can be made in layers.

The first conductive layer 100 is generally used to arrange various signal lines, that is, the first conductive portion 10 may be various signal lines, such as a common voltage line GND, a driving voltage line VLED, a source power line PWR, a source address line DI, and so on. Optionally, the thickness of the layer is about 1.5~7 μm, and the material includes copper, for example, a laminated material such as MoNb/Cu/MoNb can be formed by sputtering, the bottom layer of MoNb (300 Å) is used to improve adhesion, the middle layer of Cu is used to transmit electrical signals, and the top layer of MoNb (200 Å) is used to prevent oxidation. The layer can also be formed by electroplating, the seed layer MoNiTi is first formed to increase the nucleation density of crystal grains, and then the anti-oxidation layer MoNiTi is formed after electroplating.

The second conductive layer 200 is generally used to arrange various pads, that is, the second conductive portion 20 may be various pads, such as pads for mounting functional elements or pads for mounting functional element driving chips; the second conductive layer 200 may also be provided with a lead for connection, that is, the second conductive portion 20 may also be a lead. Optionally, the thickness of the layer is about 6000 Å, and its material can be, for example, a laminated material of MoNb/Cu/CuNi, the bottom layer of MoNb is used to improve adhesion, the middle layer of Cu is used to transmit electrical signals, and the top layer of CuNi can be used to take into account oxidation resistance and solidity of die bond.

An insulating layer is provided between the first conductive layer 100 and the second conductive layer 200.

Due to the limitation of the size and process of the substrate, when the second conductive portion 20 located on the upper layer is fabricated, it is often unavoidable to overlap with the first conductive portion 10 below, the overlap area between the two is a weak performance area, which is prone to short circuit or open circuit, resulting in defects or affecting reliability.

For example, if the pad on the upper layer overlaps the signal line on the lower layer, when the functional elements are subsequently soldered, for example, when the LED chip is soldered using SMT reflow soldering technology, because the temperature in the soldering zone reaches 260~265° C., which easily exceeds the temperature resistance value of the intermediate insulating layer, causing damage to the OC at the pad, which in turn causes the pad and the signal line to short circuit. In addition, when the LED chip is die-bonded, the acute-angle particles of the LED may also pierce the pad and the insulating layer, causing the pad and the signal line to short circuit.

For another example, if the leads on the upper layer overlap the signal lines on the lower layer, the air static electricity generated at the edge of the overlap will easily break down the insulating layer, causing the leads and the signal lines to short circuit. In addition, the particles generated during the fabricating process cannot be eliminated completely. When the particles fall in the overlap area between the lead and the signal line, it is easy to cause unstable conduction between the lead and the signal line, which affects the reliability of the product. Furthermore, when the leads on the upper layer are tested for current or voltage by the pin-piercing test method, it is easy to pierce the insulating layer and pierce the signal line below, resulting in inaccurate testing or reduced accuracy.

One reason for the short circuit of the first conductive portion 10 and the second conductive portion 20 is that the first conductive portion 10 is usually arranged thicker and wider to provide larger voltage/current and lower resistance, the second conductive portion 20 is usually arranged to be narrower and shorter, and exists as a structure such as a lead or a pad. Therefore, there is a certain potential difference between the two. Since the insulating layer between the two conductive portions is in a semi-solid and semi-liquid state during the glass-based film fabricating process before curing, the water vapor introduced in the process may remain in the insulating layer. The nature of Cu growth in the conductive portion is electrochemical corrosion, water easily triggers an electrochemical reaction in the presence of a potential difference, the $OH^-$ is formed in the insulating layer, the $OH^-$ will cause the first conductive portion 10 and the second conductive portion 20 to be short-circuited.

It can be seen, in order to ensure product quality and performance, short circuit between the first conductive portion 10 and the second conductive portion 20 should be avoided as much as possible.

The projections of at least part of the second conductive portion 20 and the first conductive portion 10 in the array substrate of the present disclosure on the base substrate do not overlap, that is, in the thickness direction of the array substrate, at least part of the second conductive portion 20 and the first conductive portion 10 do not overlap, then, where there is no overlap, the short circuit between the two due to static electricity, process technology, testing and other reasons can be avoided, thereby improving the stability of product performance. Of course, in a completely ideal situation, if the projections of all the second conductive portion 20 and all the first conductive portion 10 on the base substrate are not overlapped, the short circuit can be completely avoided.

In the present disclosure, when describing "overlap" between two structures, it means that the orthographic projection of one structure on the base substrate at least partially overlaps with the orthographic projection of the other structure on the base substrate. The array substrate of the embodiment of the present disclosure will be described in detail below.

Because the first conductive portion 10 needs to provide a larger voltage/current and a lower IR drop, it is usually arranged wider, the second conductive portion 20 is usually used as a small structure such as a lead or a pad, and is usually arranged narrower. For example, for small-sized products, the line width ratio of the first conductive portion 10 and the second conductive portion 20 is about 20 to 30, for large-size products, the line width ratio of the first conductive portion 10 and the second conductive portion 20 can be as high as 100 times or more, so the second conductive portion 20 and the first conductive portion 10 must overlap.

Referring to FIG. 2, in one embodiment, the present disclosure provides an opening area 110 in the first conductive portion 10, where, the opening area 10 not only includes a hollow area located in the middle of the first conductive portion 10, the hollow area has a complete ring-shaped edge, but also includes a hollow area located at the edge of the first conductive portion 10, the hollow area has a partial edge, which is described in detail below with reference to the drawings. Because the opening area 110 is a hollow area, the present disclosure considers that the projection of the opening area 110 on the base substrate is a projection of the edge of the peripheral film layer, that is, an annular edge, the present disclosure takes the area enclosed by the annular projection edge as a reference, so that the projection of at least part of the second conductive portion 20 (that is, the second conductive portion 20 at the overlap) on the base substrate 900 is located in the area enclosed by the projection of the opening area 110. It should be noted that, the projection of the second conductive portion 20 at the overlap is located in the area enclosed by the projection of the opening area 110 referred to in the present disclosure includes two cases: one is that at least part of the projection edge of the second conductive portion 20 is located inside the projection edge of the opening area, and the projection area of the second conductive portion 20 is smaller than the area enclosed by the projection of the opening area; the other is that the projection of the second conductive portion 20 and the area enclosed by the projection of the opening area 110 completely overlap, which means that the shapes of the two projections are the same and completely overlap. In either case, it refers to hollowing out the first conductive portion 10 under the overlapping area, so as to prevent the first conductive portion 10 and the second conductive portion 20 from being short-circuited due to static electricity, fabricating process, testing, etc. in the overlapping area, thereby avoiding affecting product performance stability.

Further, a certain gap may be provided between the projection edge of the portion of the second conductive portion 20 corresponding to the opening area 110 and the projection edge of the opening area 110, so that the second conductive portion 20 is kept a certain distance from the edge of the first conductive portion 10, which further reduces the possibility of a short circuit between the two.

In an embodiment, the second conductive portion 20 includes a plurality of groups of pads 210. In this embodiment, the pad 210 may be a pad used for mounting a functional device, such as a light-emitting device, a sensor, etc., or a pad used for mounting a driver chip of a functional device.

Figure 3:
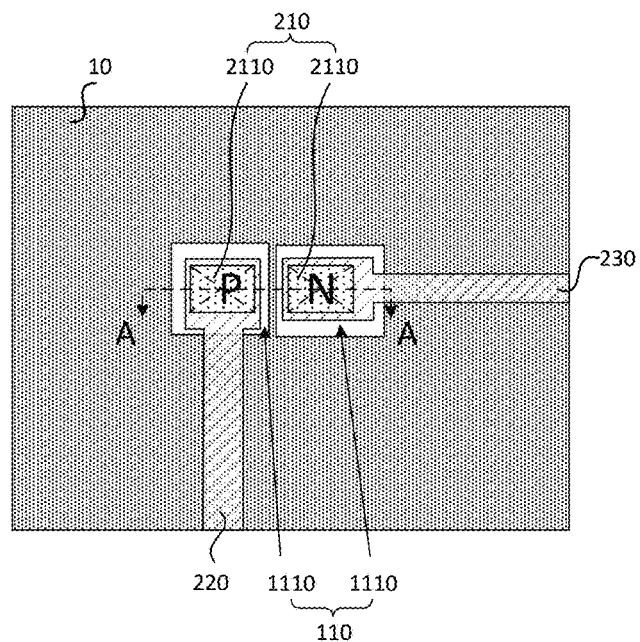
FIG. 3 is a schematic structural diagram of a pad of an LED light-emitting device in an embodiment.
Figure 4:
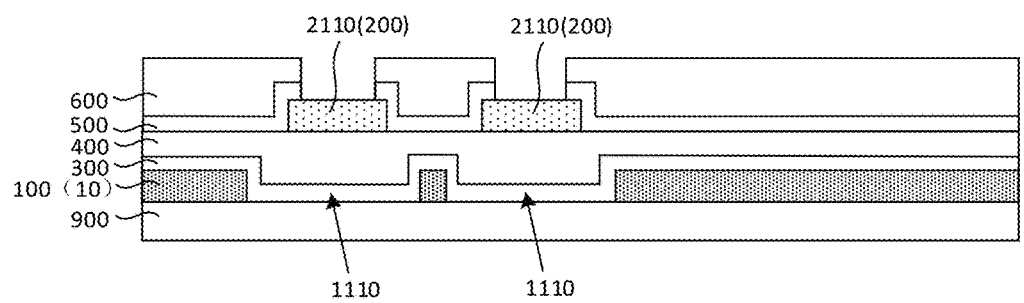
FIG. 4 is a schematic cross-sectional view taken along the A-A direction in FIG. 3.

Refer to FIG. 3, which is a partial enlarged schematic diagram of the region N in FIG. 2. Taking a pad for mounting a light-emitting device as an example, the pad 210 includes two sub-pads 2110, one is an anode pad (shown as P in the figure), and the other is a cathode pad (shown as N in the figure). Refer to FIG. 4, which is a schematic cross-sectional view taken along the A-A direction in FIG. 3.

In this embodiment, the first conductive portion 10 is a common voltage line GND, and the pad of the light-emitting device overlaps the common voltage line GND in the thickness direction of the array substrate. In this embodiment, the opening area 110 of the first conductive portion 10 includes a first opening area 111, and the first opening area 111 includes two first sub-opening areas 1110. In the thickness direction of the substrate, the projection of the anode pad on the base substrate 900 is located in an area enclosed by the projection of the first sub-opening area 1110, and there is a gap between the outer peripheral edge of projection of the anode pad and the edge of the projection of the first sub-opening area 1110. Similarly, the projection of the cathode pad on the base substrate 900 is located in the area enclosed by the projection of the other first sub-opening area 1110, and there is a gap between the outer peripheral edge of projection of the cathode pad and the edge of the projection of the first sub-opening area 1110. In this embodiment, the two first sub-opening areas 1110 are separated by the first conductive portion 10 that is not hollowed out, so that each first sub-opening area 1110 corresponds to a respective sub-pad 2110.

The area where the first conductive portion 10 faces the anode pad and the cathode pad is hollowed out, so that the anode pad, the cathode pad and the first conductive portion 10 located below no longer overlap, thereby avoiding the problem of short circuit between the pad and the first conductive portion 10 due to welding, die bonding and other reasons.

Figure 5:
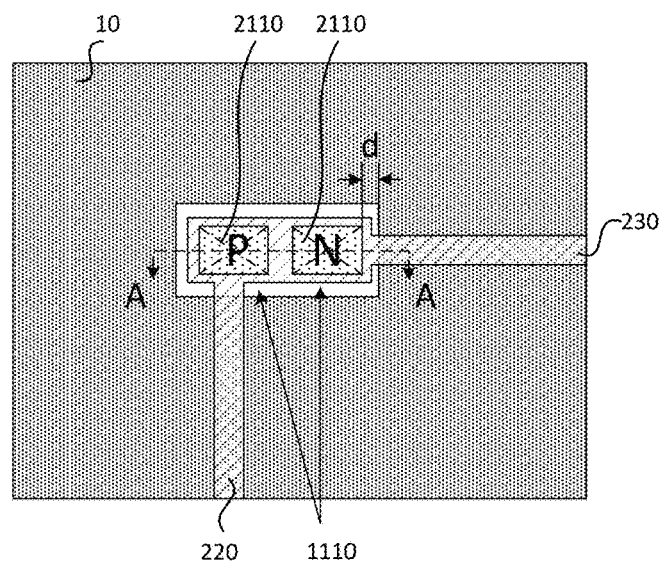
FIG. 5 is a schematic structural diagram of another pad of the LED light-emitting device.
Figure 6:
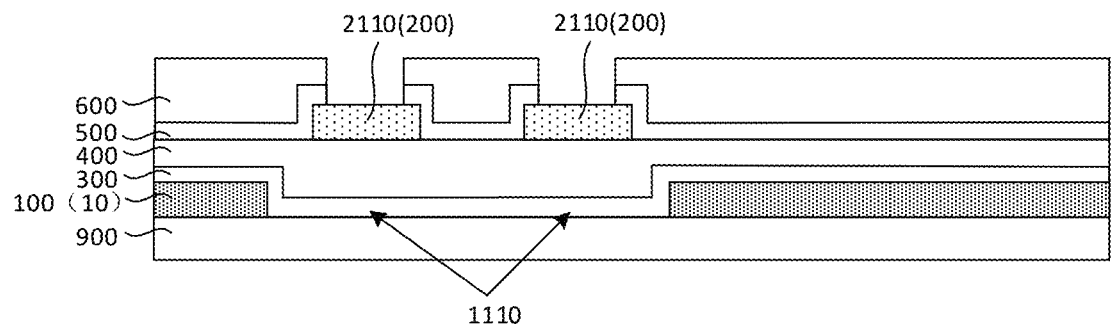
FIG. 6 is a schematic cross-sectional view taken along the A-A direction in FIG. 5.

Further, the first sub-opening areas 1110 corresponding to the sub-pads of the same group of pads connect to each other. Referring to FIGS. 5 and 6, FIG. 6 is a schematic cross-sectional view taken along the A-A direction in FIG. 5. In this embodiment, the two first sub-opening areas 1110 connect to each other to form an opening, in other words, the projections of the anode pad and the cathode pad are located in the area 110 enclosed by the projection of the same large opening area. This structure can prevent the anode pad, the cathode pad and the first conductive portion 10 from being short-circuited, and also reduces the process difficulty of hollowing out the first conductive portion 10.

In this embodiment, the shapes of the sub-pad 2110 and the first sub-opening area 1110 are the same, and both are substantially rectangular.

Figure 7:
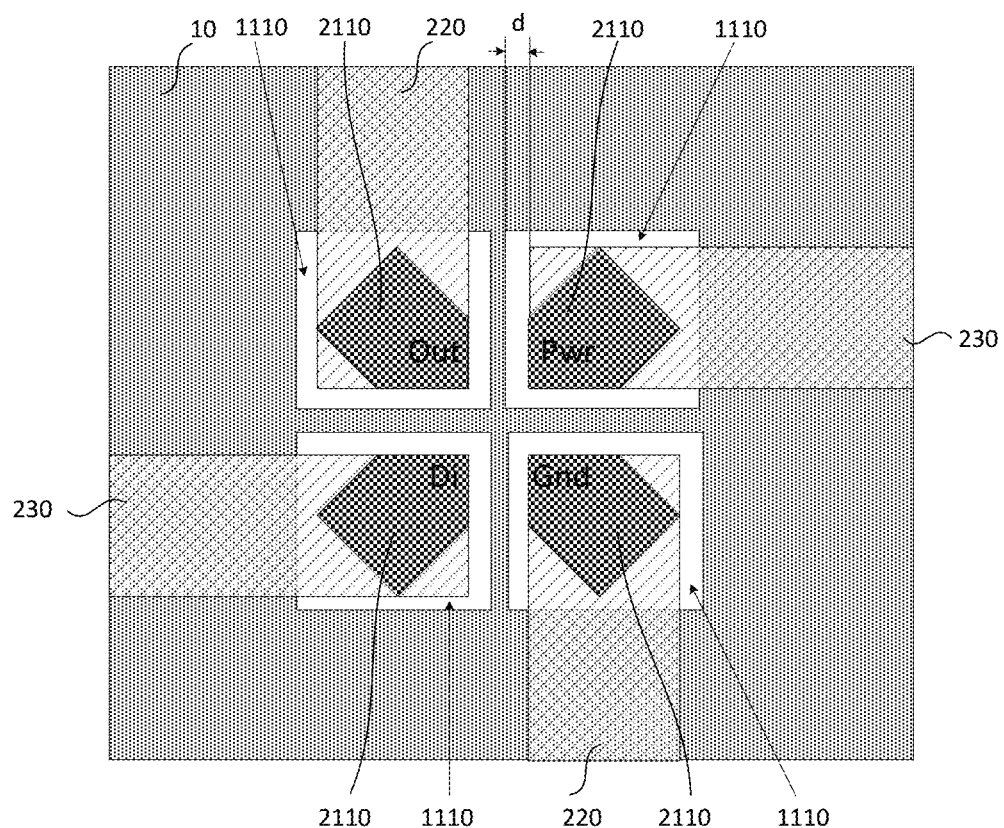
FIG. 7 is a schematic structural diagram of one kind of pad of an IC driver chip pad.

Referring to FIG. 7, taking the pad used to mount the IC driver chip as an example, the pad includes four sub-pads 2110, which are respectively a first input pad Di, a second input pad Pwr, an output pad Out, and a common voltage pad Gnd. The above-mentioned first input pad Di is configured to receive a first input signal, the first input signal is, for example, an address signal, which is used to connect to an IC driver chip with a corresponding address. For example, the first input signal may be an 8-bit address signal from the source address line DI, and the address to be transmitted can be obtained by parsing the address signal. The second input pad Pwr is configured to receive a second input signal, for example, the second input signal is a power line carrier communication signal from the source power line PWR. The second input signal not only provides power to the IC driver chip, but also transmits communication data to the IC driver chip, the communication data can be used to control the light-emitting duration of the corresponding light-emitting unit, thereby controlling its visual light-emitting brightness. The output pad Out is configured to output a driving signal. For example, the driving signal may be a driving voltage from the driving voltage line VLED for driving the light-emitting element to emit light. The common voltage pad Gnd is configured to receive a common voltage signal, such as a ground signal from the common voltage line GND.

In this embodiment, the first conductive portion 10 is the common voltage line GND, and the pads of the IC driver chip overlap the common voltage line GND in the thickness direction of the array substrate. The first opening area 111 of the first conductive portion 10 includes four first sub-opening areas 1110. In the thickness direction of the substrate, the projection of the first input pad Di on the base substrate 900 is located in the area enclosed by the projection of the first first sub-opening area 1110, and there is a gap between the outer peripheral edge of the projection of the first input pad Di and the edge of the projection of the first sub-opening area 1110. The projection of the second input pad Pwr on the base substrate 900 is located in the area enclosed by the projection of the second first sub-opening area 1110, and there is a gap between the outer peripheral edge of the projection of the second input pad Pwr and the edge of the projection of the first sub-opening area 1110. The projection of the output pad Out on the base substrate 900 is located in the area enclosed by the projection of the third first sub-opening area 1110, and there is a gap between the outer peripheral edge of the projection of the output pad Out and the edge of projection of the first sub-opening area 1110. The projection of the common voltage pad Gnd on the base substrate 900 is located in the area enclosed by the projection of the fourth first sub-opening area 1110, there is a gap between the outer peripheral edge of the projection of the common voltage pad Gnd and the edge of the projection of the first sub-opening area 1110. In this embodiment, the four first sub-opening areas 1110 are separated by the first conductive portion 10 that is not hollowed out, so that each first sub-opening area 1110 corresponds to a respective sub-pad 2110.

The area where the first conductive portion 10 faces the four sub-pads 2110 is hollowed out, so that the four sub-pads 2110 and the first conductive portion 10 located below no longer overlap, thereby avoiding the problem of short circuit between the pad and the first conductive portion 10.

Figure 8:
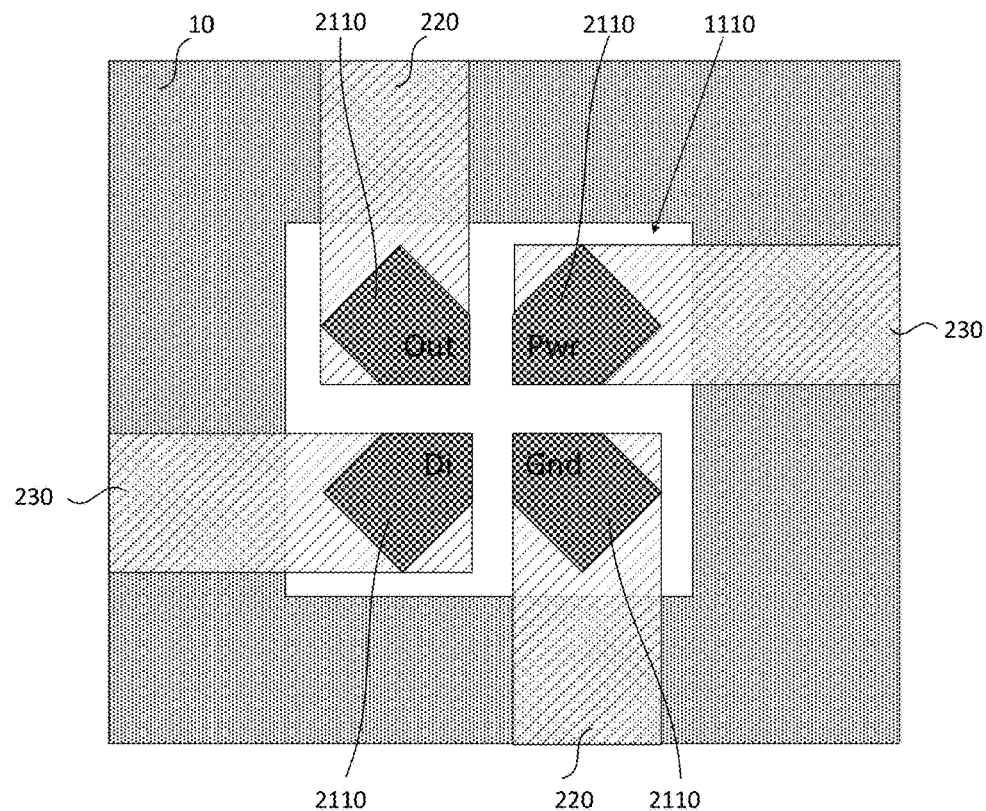
FIG. 8 is a schematic structural diagram of another kind of pad of the IC driver chip pad.

Further, the first sub-opening areas 1110 corresponding to the sub-pads of the same group of pads connect to each other, thereby reducing the difficulty of hollowing out. Referring to FIG. 8, in this embodiment, the four first sub-opening areas 1110 connect to each other to form an opening, in other words, the projections of the first input pad Di, the second input pad Pwr, the output pad Out, and the common voltage pad Gnd are located in the area enclosed by the projection of the same large opening area 110. This structure can prevent each sub-pad 2110 from being short-circuited with the first conductive portion 10 located below, and also reduces the accuracy requirements for the hollowing process of the first conductive portion 10.

In this embodiment, the shape of the sub-pad 2110 is approximately a pentagon, and the shape of the first sub-opening area 1110 is approximately a rectangle.

It should be noted that the present disclosure does not limit the specific shape of the first sub-opening area 1110, which may be consistent or inconsistent with the shape of the sub-pad 2110. Where, "approximately pentagonal" and "approximately rectangular" mean that the outer contour of the sub-pad 2110 and the shape of the boundary of the first sub-opening area 1110 are pentagonal or rectangular as a whole, but not limited to a standard pentagon or rectangle.

In other embodiments, the pad may also have other numbers of sub-pads, for example, one or three sub-pads and the like. Correspondingly, the first opening area 111 includes a corresponding number of first sub-opening areas 1110, so that each sub-pad corresponds to a first sub-opening area 1110 below to avoid overlapping at the sub-pads, which will not be repeated one by one here.

The present disclosure does not limit the number of pads. Taking the structure shown in FIG. 1 as an example, the array substrate includes a plurality of light-emitting device pads and a plurality of IC driver chip pads. In an embodiment, the first sub-opening areas 1110 corresponding to all the pads used to bind the same functional device are connected to each other, for example, all the first sub-opening areas 1110 corresponding to the pads of the light-emitting devices are connected to each other, the first sub-opening areas 1110 corresponding to the pads of all the IC driver chips are connected to each other.

Figure 9:
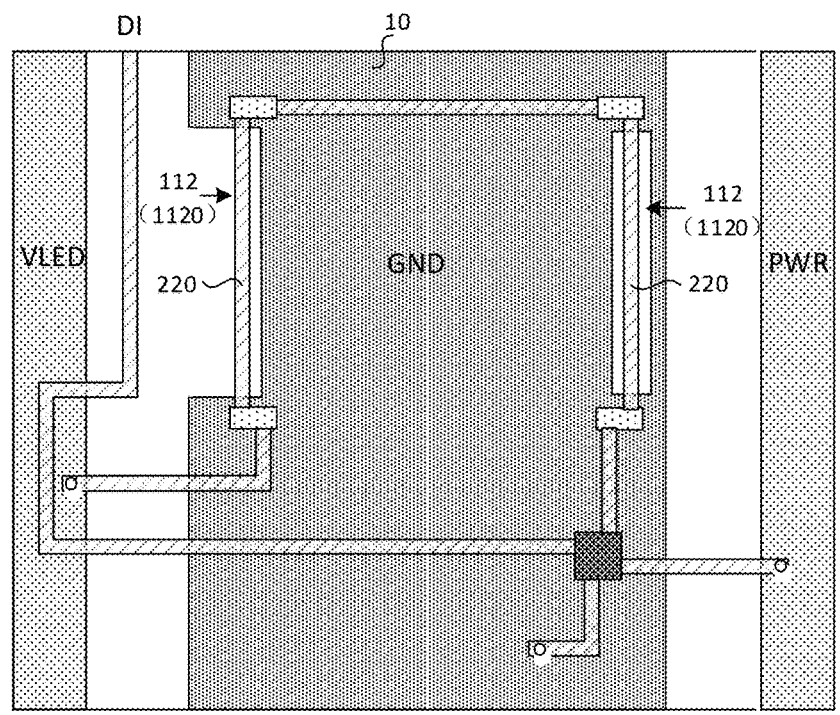
FIG. 9 is a schematic structural diagram of a first lead.

In an embodiment, referring to FIG. 9, the second conductive portion 20 includes a first lead 220, the first lead 220 extends in the longitudinal direction (first direction) in the figure. Taking the figure shown as an example, the first lead 220 is a longitudinal lead extending from the LED light-emitting device. In other embodiments, the first lead 220 may also be a longitudinal lead extending from the IC driver chip pad.

Continuing to refer to FIG. 9, in this embodiment, the first conductive portion 10 is also the common voltage line GND, the longitudinally extending first lead overlaps the longitudinally extending portion of the common voltage line GND in the thickness direction of the array substrate.

The opening of the first conductive portion 10 includes a second opening area 112, and the second opening area 112 is located at a longitudinally extending portion of the first conductive portion 10. The second opening area 112 includes at least one second sub-opening area, and the projection of at least one section of the first lead 220 on the base substrate 900 is located in the area enclosed by the projection of the second sub-opening area 112, that is, the first conductive portion 10 corresponding to at least one section of the first lead 220 is hollowed out, so that the first lead 220 and the first conductive portion 10 located below no longer overlap in this area, thereby avoiding the short circuit between the first lead 220 and the first conductive portion 10 due to static electricity, testing, and fabricating process.

The bottom of the first lead 220 may be hollowed out, as shown in FIG. 9, or only one section may be hollowed out. In other words, the second opening area 112 may be disposed under all the first leads 220, or may be only disposed under a partial area of the first leads 220. The second opening area 112 corresponding to the bottom of the first lead 220 in FIG. 9 only includes one second sub-opening area 1120. In other embodiments, it may also include a plurality of second sub-opening areas. When there are a plurality of the second sub-opening areas 1120, at least two second sub-opening areas 1120 may also be connected to each other, thereby reducing the difficulty of hollowing out.

In the present disclosure, there is a gap between the projection edge of at least one side of the first lead 220 and the projection edge of the second opening area 112. Specifically, in an embodiment, referring to FIG. 9, the second opening area 112 on the right is a closed area arranged inside the first conductive portion 10, and has four borders, the projection edges on the left and right sides of the first lead 220 and the right and the projection edges on the left and right sides of the second opening area 112 both have gaps. The second opening area 112 on the left is a semi-closed area provided at the inner edge of the first conductive portion 10, that is, the second opening area 112 has three boundaries, the left side is connected with the blank area outside the first conductive portion 10, and there is a gap between the right side projection edge of the first lead 220 on the left side and the right side projection edge of the second opening area 112.

Figure 10:
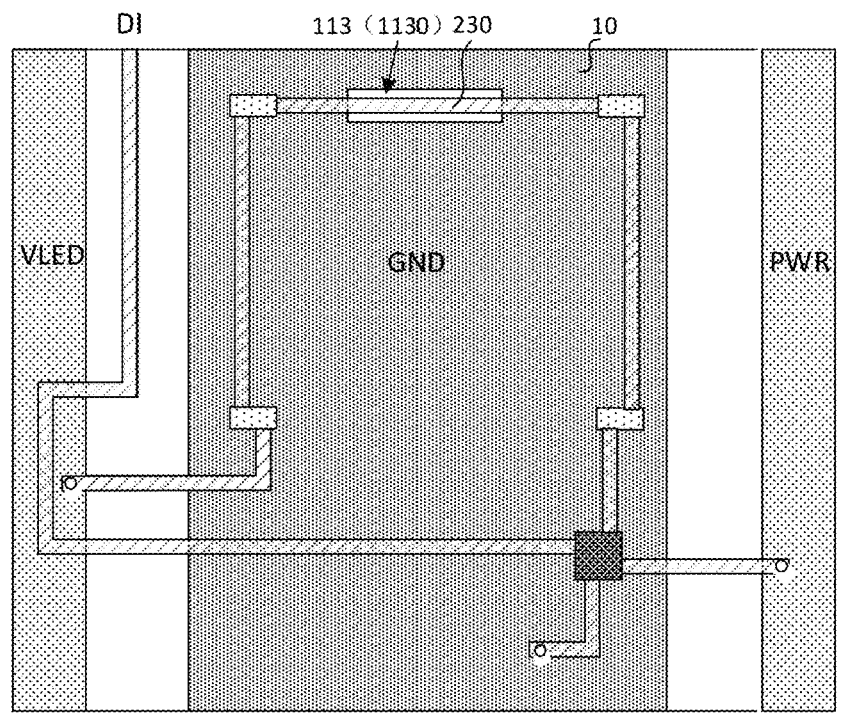
FIG. 10 is a schematic structural diagram of a second lead.

In an embodiment, referring to FIG. 10, the second conductive portion 20 further includes a second lead 230, and the second lead 230 extends in a lateral direction. The second lead 230 may be a lateral lead extending from the IC driver chip pad, or may be a lateral lead extending from the LED light-emitting device.

In this embodiment, the first conductive portion 10 is also the common voltage line GND, and the second lead 230 extending laterally overlaps the longitudinally extending portion of the common voltage line GND in the thickness direction of the array substrate.

The opening of the first conductive portion 10 includes a third opening area 113, and the third opening area 113 is located at a longitudinally extending portion of the first conductive portion 10; the third opening area 113 includes at least one third sub-opening area, and the projection of at least one section of the second lead 230 on the base substrate 900 is located in the area enclosed by the projection of the third sub-opening area 113. In other words, the first conductive portion 10 corresponding to at least one section of the second lead 230 is hollowed out, so that the second lead 230 and the first conductive portion 10 located below no longer overlap in this area, thereby avoiding a short circuit between the second lead 230 and the first conductive portion 10 due to static electricity, testing, and fabricating processes.

The bottom of the second lead 230 may be hollowed out completely, or only one section may be hollowed out. In other words, the third opening area 113 may be provided under all the second leads 230, or only under a partial area of the second lead 230. The third opening area 113 corresponding to the second lead 230 in FIG. 9 includes only one third sub-opening area 1130, in other embodiments, a plurality of third sub-opening areas 1130 may also be included. When the number of third sub-opening areas 1130 is a plurality, at least two third sub-opening areas may also be connected to each other, thereby reducing the difficulty of hollowing out.

In this embodiment, the first conductive portion 10 under the second lead 230 is hollowed out, thereby avoiding a short circuit between the second lead 230 and the first conductive portion 10 due to static electricity and fabricating processes.

In the present disclosure, in the longitudinal direction, the third opening area 113 corresponding to the second lead 230 may be located at the upper edge or the lower edge of the first conductive portion 10, or may be located in the middle of the first conductive portion 10. Therefore, there is a gap between the projection edge of at least one of the upper and lower sides of the second lead 230 and the projection edge of the third opening area 113. The third opening area 113 shown in FIG. 10 is a closed opening area, and the projection of a section of the second lead 230 overlaps with the projection of the third opening area 113, and there is a gap between the projection edge of at least one of the upper and lower sides and the projection edge of the third opening area 113.

It should be noted that since the second lead 230 extends in the lateral direction, the third opening area 113 also extends in the lateral direction. For the third opening area 113 in the first conductive portion 10, the lateral length of the third opening area 113 should be smaller than the width of the first conductive portion 10, otherwise the first conductive portion 10 will be cut off. Therefore, when the second lead 230 passes through the entire first conductive portion 10 in the lateral direction, only a part of below the second lead 230 should be hollowed out. It can be understood that the longer the length of the third opening area 113 in the lateral direction, the greater the influence on the IR Drop of the longitudinally extending first conductive portion 10, resulting in a decrease in signal strength. However, the longer the length of the third opening area 113 in the lateral direction, the less the overlapping area of the second lead 230 and the first conductive portion 10, and the less likely it is to generate static electricity. In actual products, the lateral length of the third opening area 113 needs to be comprehensively considered for the above two reasons. In addition, the second lead 230 can also span a plurality of first conductive portions 10 extending longitudinally at the same time. Then, each first conductive portion 10 can be provided with one or more third sub-opening areas 1130. When a second lead 230 does not span the first conductive portion 10, that is, when the projection of the second lead 230 is only within the projection of one first conductive portion 10, the corresponding third opening area 113 may include a plurality of third sub-opening areas 1130, which correspond to multiple portions of the second lead 230, respectively.

In other embodiments, the second direction in which the second lead 230 extends may not be perpendicular to the first direction. Regardless of the direction, it should be ensured that the third opening area 113 corresponding to the second lead 230 will not cut off the first conductive portion 10, and the influence on IR Drop should be minimized.

In this embodiment, since the shape of the first lead 220 or the second lead 230 is generally a strip shape, the shapes of the second opening area 112 and the third opening area 113 are also generally strip shape. The present disclosure does not limit the specific shapes of the second opening area 112 and the third opening area 113, which may be consistent or inconsistent with the shape of the lead.

Figure 11:
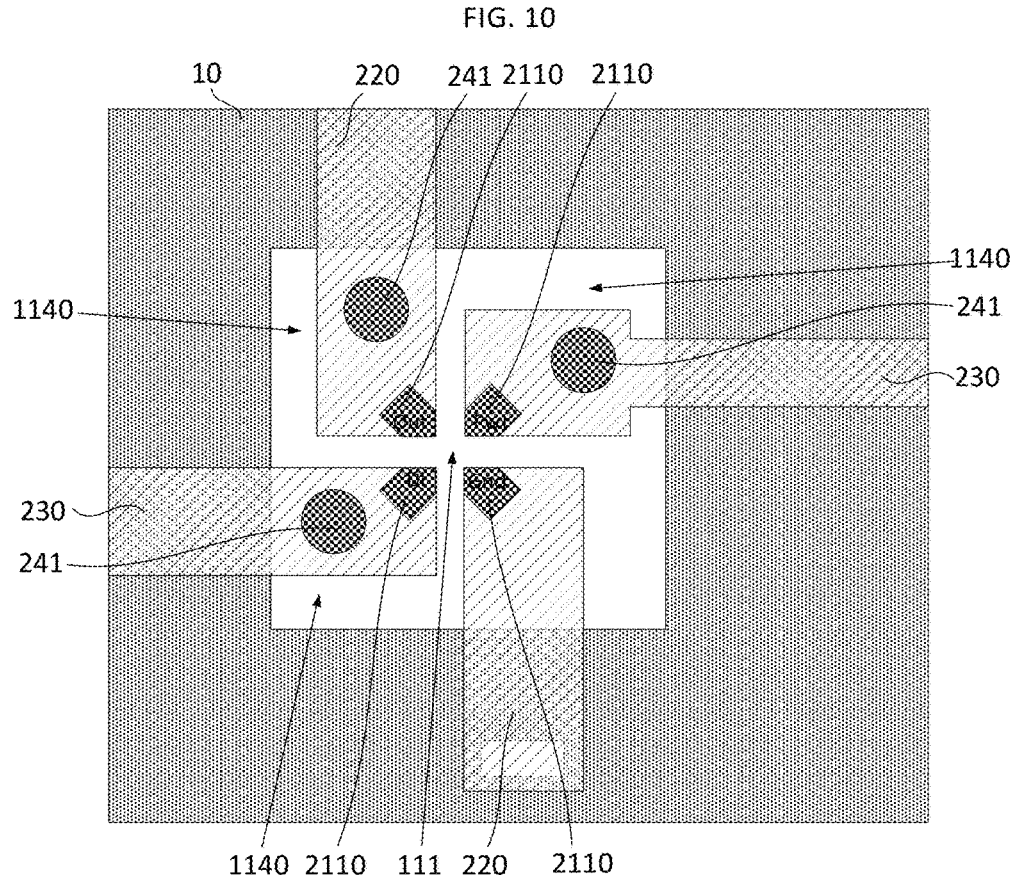
FIG. 11 is a schematic structural diagram of a first test conductive portion.

In an embodiment, the second conductive portion 20 further includes several functional units for realizing specific functions. For example, in this embodiment, the functional unit may be a first test conductive portion 241, which is electrically connected to the pad, the first lead, or the second lead, and is used to detect the electrical properties of the pad, the first lead, or the second lead. For example, the pin-piercing test method can be used to test the current or voltage characteristics of the pad, specifically, FIG. 11 shows the first test conductive portion 241 corresponding to the three sub-pads of the IC driver chip pad and the fourth opening area 114, the three first test conductive portions 241 are respectively correspondingly arranged near the first input pad Di, the second input pad Pwr, and the output pad Out, one end is connected to the sub-pad for testing the voltage and/or current of the sub-pad, and the other end can also be connected to the first lead or the second lead. The film layer (for example, the second insulating layer 600 and the second inorganic layer 500) above the first test conductive portion 241 is opened, so that the first test conductive portion 241 is exposed to the outside, so that a pin-piercing test can be performed there.

The opening area 110 includes a fourth opening area 114, and the fourth opening area 114 includes three fourth sub-opening areas 1140, the projections of the three first test conductive portions 241 on the base substrate are located in the projections of the fourth sub-opening areas 1140 in a one-to-one correspondence, there is a gap between the projection of the first test conductive portion 241 and the projection edge of the corresponding fourth sub-opening area 1140. In other words, the first conductive portion 10 corresponding to the bottom of the first test conductive portion 241 is hollowed out, so that the first test conductive portion 241 and the lower first conductive portion 10 no longer overlap in this area, thereby preventing the pin from piercing the first test conductive portion 241 and contacting the first conductive portion 10 to cause a short circuit or inaccurate testing during the pin-piercing test. Since the common voltage pad Gnd is connect to the common voltage line GND through a via hole, the current or voltage of the common voltage pad Gnd can be directly tested on the common voltage line GND. The number of the first test conductive portions 241 in this embodiment is only an example, and the specific number can be set according to needs. For example, only one first test conductive portion 241 may be provided for a certain sub-pad, and the number of the first test conductive portion 241 is not specifically limited in this disclosure. In this embodiment, the three fourth sub-opening areas 1140 connect to each other, thereby reducing the difficulty of hollowing out. In other embodiments, the fourth sub-opening areas 1140 may also be independent of each other.

The types of the various second conductive portions 20 and the opening areas 110 corresponding to the first conductive portions have been described in detail above. The array substrate of the present disclosure may only include any one of the above-mentioned second conductive portions 20 and the corresponding opening areas 110, or may include at least any two types of the second conductive portions 20 and the corresponding two opening areas 110. For example, the array substrate may include the pad 210 and the first lead 220 arranged longitudinally, and further include a first opening area 111 and a second opening area 112; It may also include a pad 210 and a first test conductive portion 241, and also include a first opening area 111 and a fourth opening area 114; It may also include the pad 210, the first lead 220, the second lead 230, and the first test conductive portion 241 at the same time, and may also include a first opening area 111, a second opening area 112, a third opening area 113, and a fourth opening area 114, etc., which are not listed here.

In the present disclosure, when a plurality of kinds of opening areas are included, the plurality of kinds of opening areas can be connected to each other, so as to further form a larger opening, thereby reducing the difficulty of hollowing out. That is, at least two of the first opening area 111, the second opening area 112, the third opening area 113, and the fourth opening area 114 are in communication with each other. The corresponding pad 210, the first lead 220, the second lead 230, or the first test conductive portion 241 in the larger opening may be connected to each other or not.

For example, referring to FIG. 11, each fourth opening area 114 of the first test conductive portion 241 may connect to each first opening area 111 corresponding to the adjacent sub-pad to form a large opening area.

Figure 12:
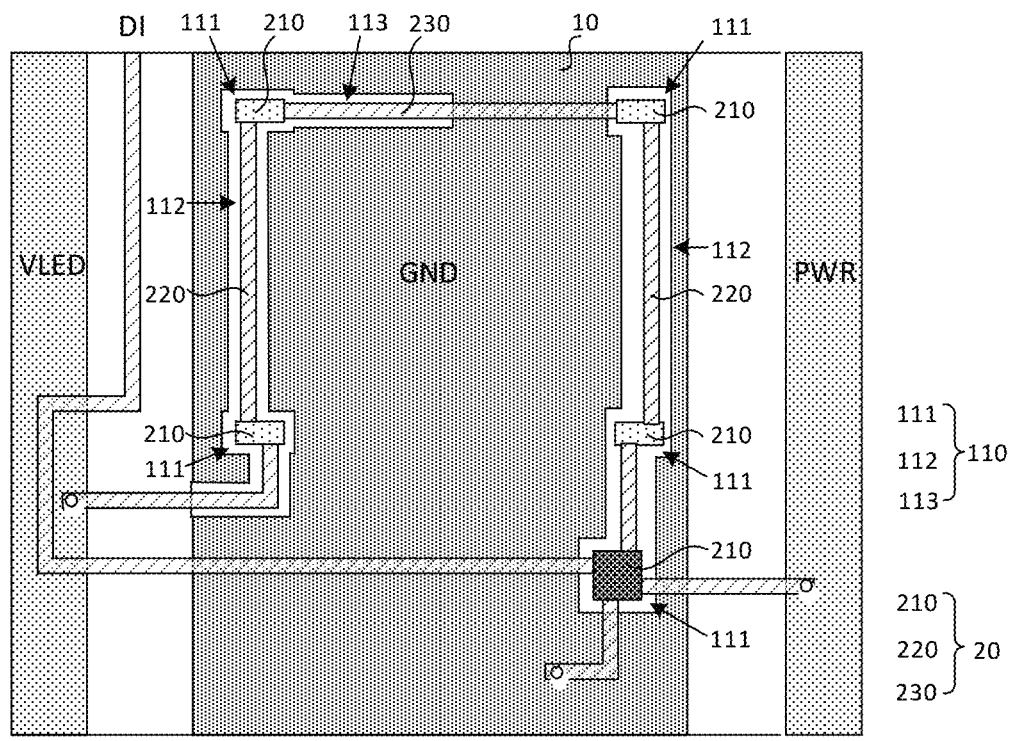
FIG. 12 is a schematic structural diagram showing each opening area communicating with each other.

For another example, referring to FIG. 12, in the array substrate, the first opening area 111 below the pad of the first LED light-emitting device at the bottom left, the second opening area 112 below the first lead 220 on the left, the first opening area 111 below the pad 210 of the second LED light-emitting device on the upper left and the third opening area 113 below the horizontal second lead 230 are connected in sequence. The first opening area 111 below the pad 210 of the third LED light-emitting device on the upper right, the second opening area 112 below the first lead 220 on the right, the first opening area 111 below the pad 210 of the fourth LED light-emitting device at the bottom right are connected in sequence.

At the same time, as shown in the figure, the first opening area 111 corresponding to the pad of the IC driver chip and the first opening area 111 corresponding to the pad 210 of the LED light-emitting device are also connected to each other.

In the above embodiment, referring to FIG. 7, a certain gap d should be ensured between the projection edge of the second conductive portion 20 on the base substrate 900 and the projection edge corresponding to the sub-opening area, so as to ensure that the second conductive portion 20 does not contact the first conductive portion 10 below. In this embodiment, the gap is greater than or equal to a preset value, and the preset value includes the sum of the process tolerance, the maximum dimension of impurities, and the reserved spacing. Among them, the process tolerance is referred to the allowable dimensional deviation in the relevant process of the process, because the gap d is formed between the first conductive portion 10 and the second conductive portion 120, the tolerances of these two film layers will affect the dimension of the gap, it includes the fabricating process tolerance of the first conductive portion and the fabricating process tolerance of the second conductive portion. The maximum dimension of impurities is referred to the maximum diameter of impurity particles (particle) encountered in the process, if the impurity particles fall into the gap, the first conductive portion and the second conductive portion may be connected. Therefore, the influence of the impurity dimension needs to be considered when designing the gap dimension. The reserved spacing is referred to a spacing value artificially set in order to form a gap. When the gap between the second conductive portion 20 and the projection edge of the sub-opening area is greater than or equal to the sum of the foregoing values, the contact between the two due to fabricating process tolerances can be avoided, and the contact between the two due to the presence of impurity particles can also be avoided to ensure that there is a sufficient distance between the second conductive portion 20 and the first conductive portion 10 located below to prevent short circuits. Of course, on this basis, the preset value may further include dimensional deviation caused by other factors. In the structure shown in FIG. 7, since the edge of the first opening area 111 and the edge of the sub-pad 2110 have different shapes, it should be ensured that the minimum gap d between the projection edge of the sub-pad 2110 and the corresponding projection edge of the first opening area 111 is greater than or equal to the preset value.

According to the current process technology, the process tolerance is about ±5 μm, the maximum dimension of impurities is about ±10 μm, and the reserved spacing is preferably 5 μm, therefore, the gap d between the projection edge of the second conductive portion 20 and the projection edge of the opening area 110 is greater than or equal to 20 μm. Further, because the opening area is too large, the IR Drop of the first conductive portion 10 may be too large, the gap between projection edges of the second conductive portion 20 and the opening area 110 is preferably less than or equal to 100 μm, so that the IR Drop of the first conductive portion 10 can be minimized.

In an embodiment, referring to FIGS. 13-20, the first conductive layer 100 further includes a plurality of conductive islands 120, at least one sub-opening area has a conductive island 120, and there is a gap between the outer periphery of the conductive island 120 and the first conductive portion 10. The conductive island 120 and the first conductive portion 10 are made of the same material, and it can also be understood that the first conductive portion 10 is dug into an annular slot to form a separate conductive area, that is, the conductive island 120. The second conductive portion 20 above the opening area with the conductive island 120 is just above the conductive island 120, and the projection of the second conductive portion 20 on the base substrate 900 is correspondingly located within the projection of the conductive island 120 or completely overlaps with the projection of the conductive island 120. Since the second conductive portion 20 is located above the conductive island 120, and the conductive island 120 is spaced from the first conductive portion 10, even if the second conductive portion 20 and the conductive island 120 are short-circuited, the first conductive portion 10 will not be affected.

In the present disclosure, when describing "completely overlap" between two structures, it means that the orthographic projection of one structure on the base substrate is completely located within the orthographic projection of the other structure on the base substrate.

Figure 13:
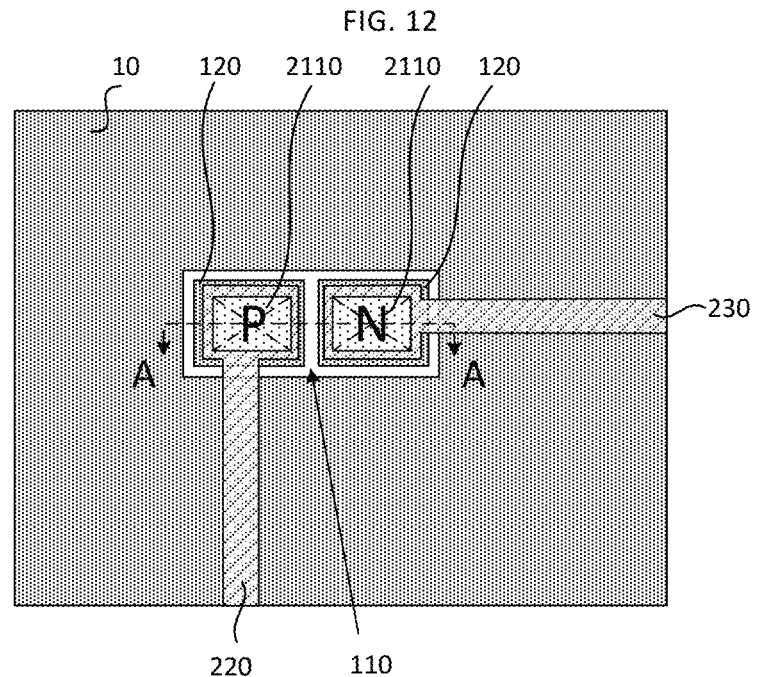
FIG. 13 is a schematic structural diagram of a pad including conductive islands of an LED light-emitting device.
Figure 14:
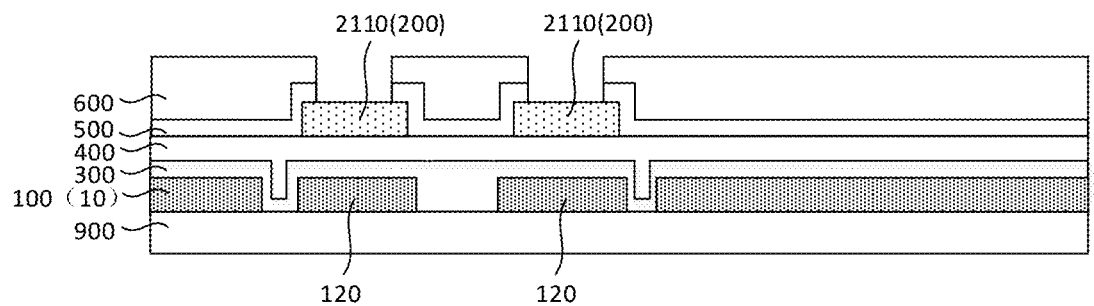
FIG. 14 is a schematic cross-sectional view taken along the A-A direction in FIG. 9.
Figure 15:
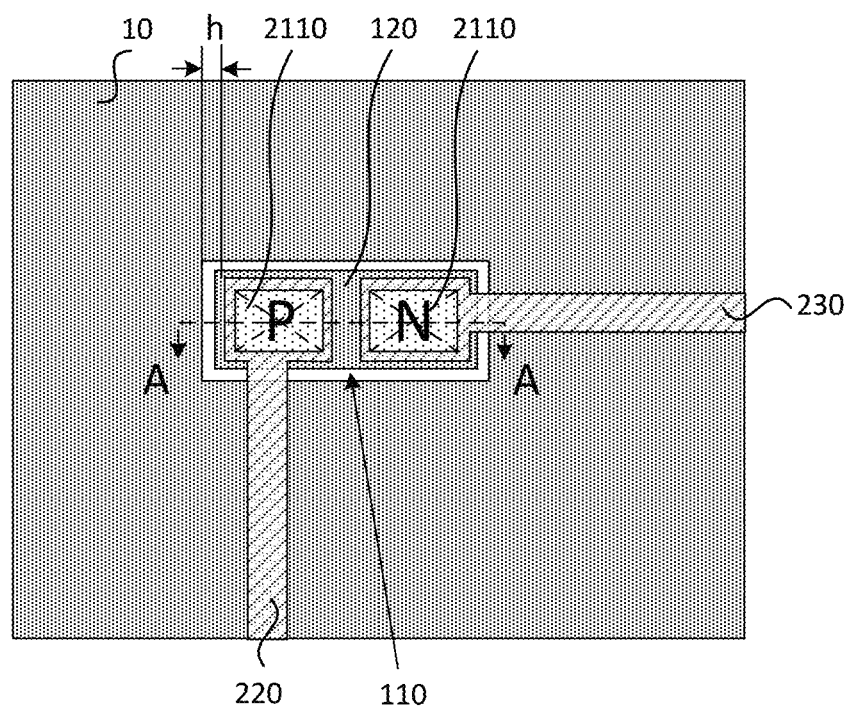
FIG. 15 is a schematic structural diagram of another pad including conductive islands of an LED light-emitting device.
Figure 16:
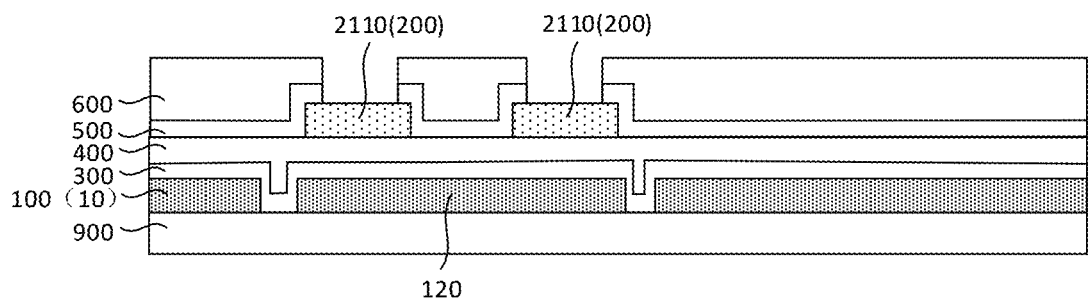
FIG. 16 is a schematic cross-sectional view taken along the A-A direction in FIG. 11.

For example, taking a pad for mounting an LED light-emitting device as an example, referring to FIG. 13 and FIG. 14, a conductive island 120 is correspondingly provided in the first sub-opening area 1110 under the anode pad, and a conductive island 120 is correspondingly provided in the first sub-opening area 1110 under the cathode pad, there is a gap between the outer periphery of each of the two conductive islands 120 and the first conductive portion 10. In an embodiment, referring to FIGS. 15 and 16, the two first sub-opening areas 1110 connect with each other to form an opening, the two conductive islands 120 are connected to each other to form an integral structure, thereby reducing the difficulty of slotting and facilitating processing.

Take the pad used to mount the IC driver chip as an example, refer to FIG. 17, a conductive island 120 is respectively provided in the first sub-opening area 1110 below the first input pad Di2113, the second input pad Pwr2114, the output pad Out2115, and the common voltage pad Gnd2116. There is a gap between the outer periphery of each of the four conductive islands 120 and the first conductive portion 10, and the four first sub-opening areas 1110 connect with each other to form an opening. In an embodiment, referring to FIG. 18, four conductive islands 120 are connected to each other to form an integral structure.

Figure 19:
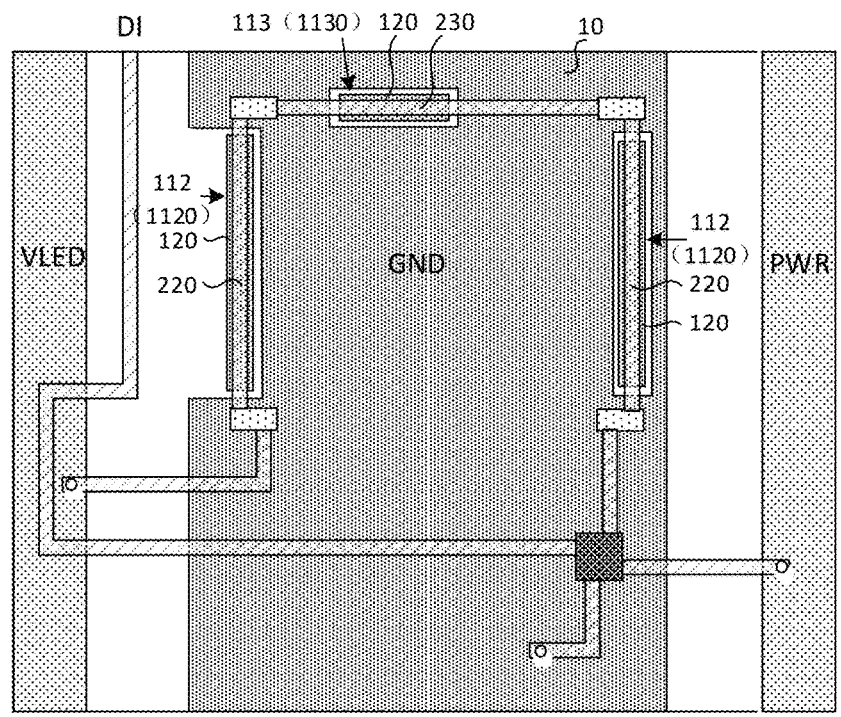
FIG. 19 is a schematic structural diagram showing both the first lead and the second lead including conductive islands.

Taking the first lead 220 and the second lead 230 as an example, referring to FIG. 19, a conductive island 120 is provided in the second opening area 112 under the first lead 220, and there is a gap between the outer periphery of the conductive island 120 and the first conductive portion 10.

Figure 20:
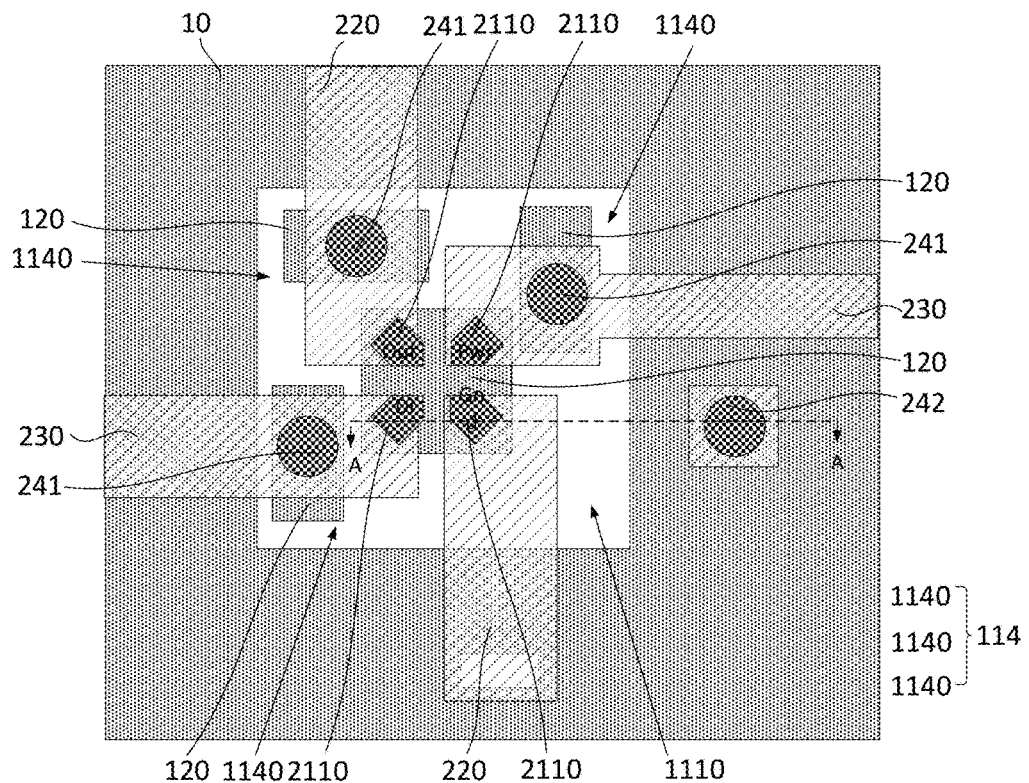
FIG. 20 is a schematic structural diagram showing a first test conductive portion including conductive islands and a second test conductive portion.

Taking the first test conductive portion 241 as an example, referring to FIG. 20, a conductive island 120 is provided in each of the three fourth sub-opening areas 114 under the three first test conductive portions 241, and there is a gap between the outer periphery of the conductive island 120 and the first conductive portion 10.

Figure 17:
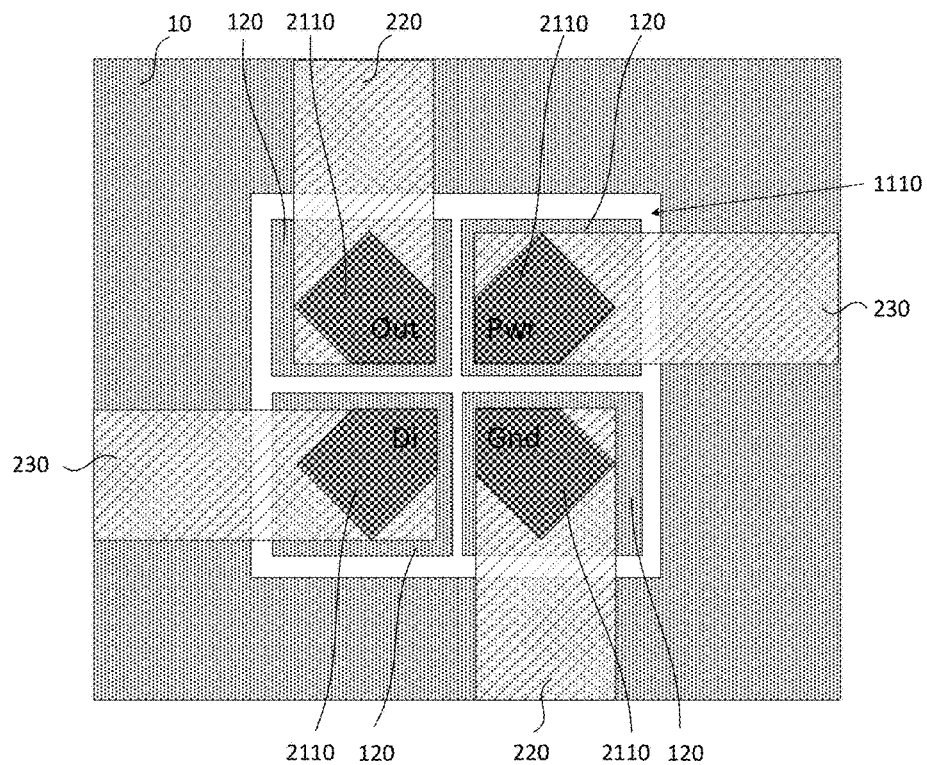
FIG. 17 is a schematic structural diagram of a pad including conductive islands of an IC driver chip pad.
Figure 18:
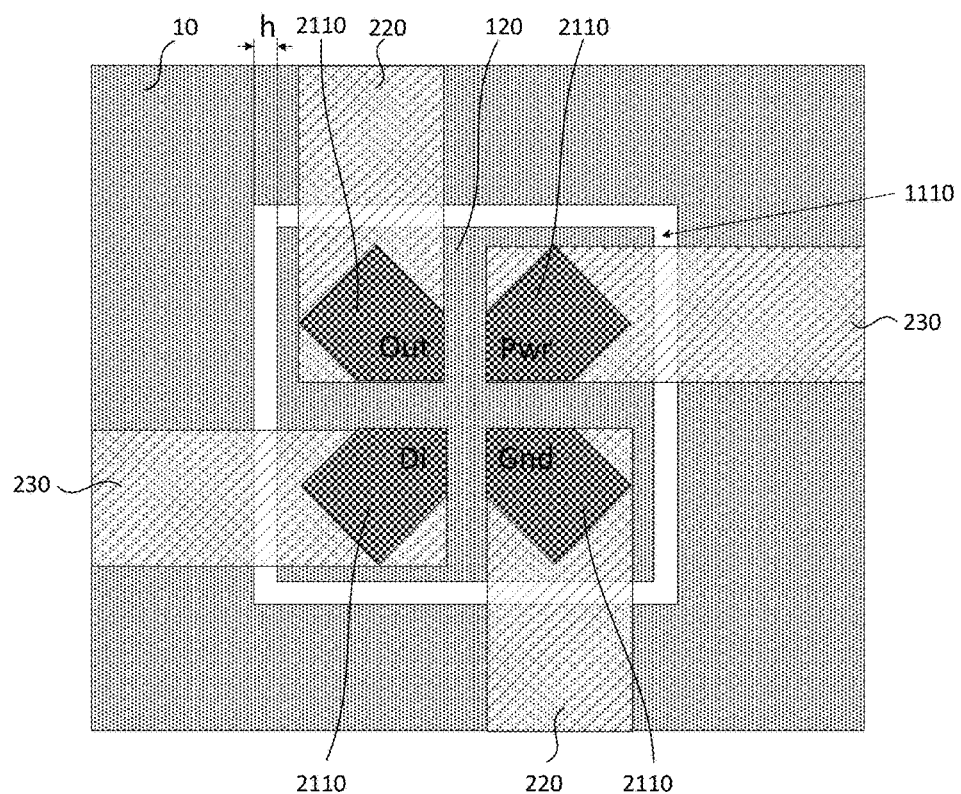
FIG. 18 is a schematic structural diagram of another pad including conductive islands of an IC driver chip pad.

In the structures shown in FIGS. 14 and 17, the sub-opening areas of the opening areas under the same pad are connected to each other, and the conductive islands 120 in the sub-opening areas are independent of each other. In the structures shown in FIGS. 15 and 18, the sub-opening areas of the opening areas under the same pad are connected to each other, and the conductive islands 120 in the sub-opening areas are connected to each other to reduce the difficulty of fabrication. Of course, in other embodiments, at least two of the first opening area 111, the second opening area 112, the third opening area 113, and the fourth opening area 114 may be connected to each other, and the conductive islands in the connected opening areas 120 can also be independent of each other or connected as a whole. For example, the two conductive islands 120 under the pad 210 and the first lead 220 can also be connected to each other to form an integrated structure, the two conductive islands 120 under the first lead 220 and the second lead 230 can also be connected to each other to form an integral structure, or the conductive islands 120 under the pad 210 and the first test conductive portion 241 may also be connected to each other, that is, the conductive islands in any opening area that are connected to each other can be connected as a whole.

A certain gap h should also be ensured between the outer periphery of the conductive island 120 and the edge of the sub-opening area of the first conductive portion 10 to ensure that the second conductive portion 20 above the conductive island 120 does not form an electrical contact with the first conductive portion 10 below. Similar to the gap d, the gap h is preferably greater than or equal to a preset value including the sum of the process tolerance, the maximum dimension of impurities, and the reserved spacing. The difference is that since the gap h is formed between the first conductive portion 10 and the conductive island 120 in the same first conductive layer, when calculating the preset value, the fabricating process tolerance is referred to the fabricating process tolerance brought about by the related process when the first conductive portion is fabricated. Similarly, the gap h between the outer periphery of the conductive island 120 and the edge of the sub-opening area of the first conductive portion 10 is preferably greater than or equal to 20 μm, thereby avoiding the contact between the conductive island 120 and the first conductive portion 10 due to factors such as process deviations. Further, the gap h between the outer periphery of the conductive island 120 and the edge of the sub-opening area of the first conductive portion 10 is also preferably less than or equal to 100 μm, so that the IR Drop of the first conductive portion 10 can be minimized.

In the embodiments of the present disclosure, the first conductive portion may be formed by two processes of magnetron sputtering or electroplating. Because electroplating is usually used to form a thick film layer, if a hollowed out structure is formed in the opening area, a large film thickness gap will often appear at the edge of the opening area. In consideration of the uniformity or flatness of the film, it is actually not desirable to have a large thickness difference, therefore, when an electroplating process is used, it is preferably used to prepare an array substrate containing a conductive island structure, and the film formed thereby has a thicker thickness and better flatness. The thickness of the film usually formed by the magnetron sputtering process is thinner than that of the electroplating process, and it is more suitable for forming a structure in which the opening area is hollowed out.

Figure 21:
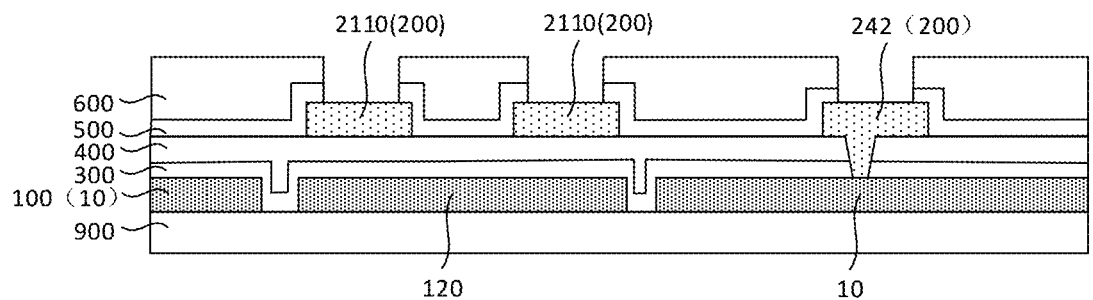
FIG. 21 is a schematic cross-sectional view taken along the A-A direction in FIG. 20.

Referring to FIGS. 20 and 21, FIG. 21 is a schematic cross-sectional view taken along A-A direction in FIG. 20, the second conductive layer further includes a second test conductive portion 242, the projections of the second test conductive portion 242 on the base substrate overlaps that of the first conductive portion 10 and the second test conductive portion 242 and the first conductive portion 10 are electrically connected through a via hole. The second test conductive portion 242 is used to detect the electrical performance of the first conductive portion 10. For example, when the common voltage line GND needs to be tested, the second test conductive portion 242 may be provided in the second conductive layer, and the second test conductive portion 242 is electrically connected to the common voltage line GND through the via hole, the performance data of the common voltage line GND can be obtained. However, in the prior art, the film layer above the area to be tested of the first conductive portion 10 is opened, so that the first conductive portion 10 is directly tested. Then, during the preparation process, the area to be tested of the first conductive portion 10 needs to be exposed to the air to wait for the preparation of other film layers above, due to material performance limitations, the first conductive portion 10 is prone to corrosion if exposed for too long, which affects signal transmission. The second test conductive portion 242 covers the first conductive portion 10 to protect the first conductive portion 10 from corrosion. The second test conductive portion 242 belongs to the second conductive layer, and the copper-nickel alloy in its material has strong corrosion resistance, and it is not easy to corrode even if exposed to the outside, which can ensure a good test effect.

Figure 22:
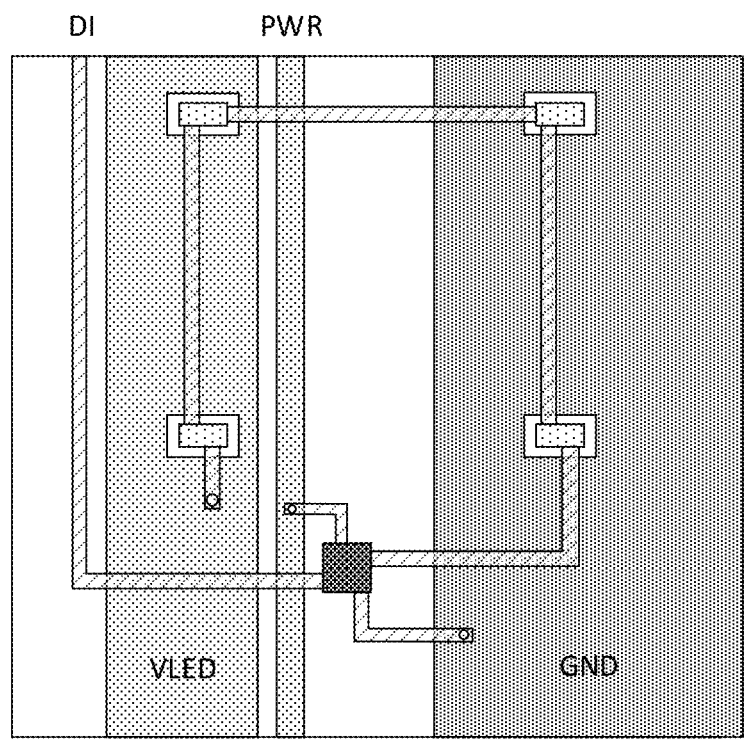
FIG. 22 is another partial enlarged view of region M in FIG. 1.

In the above embodiments, the overlapping of each pad, lead, and the common voltage line GND is taken as an example for description. In other embodiments, referring to FIG. 22, it is another partial enlarged view of the region M in FIG. 1, that is, a schematic diagram of the layout of another array substrate. Each pad and lead can also overlap with other signal lines, for example, overlap with the driving voltage line VLED, that is, the first conductive portion 10 may also be the driving voltage line VLED, and the corresponding opening area 110 is arranged in the driving voltage line VLED. The specific structure is similar to that of the embodiment described above, and will not be repeated here.

The array substrate of the present disclosure can be used as a substrate with a light-emitting function by binding light-emitting devices, and can also be further applied to a display device as a backlight unit.

Embodiments of the present disclosure also provide a display device, which includes the array substrate in the above-mentioned embodiments. Since the display device includes the above-mentioned array substrate, it has the same beneficial effects, and will not be repeated here.

The present disclosure does not specifically limit the application of the display device, which can be any product or component with flexible display function such as a TV, a laptop, a tablet computer, a wearable display device, a mobile phone, a car display, a navigation, an e-book, a digital photo frame, an advertising light box, etc.

Those skilled in the art will easily think of other embodiments of the present disclosure after considering the specification and practicing the disclosure disclosed herein. This application is intended to cover any variations, uses or adaptive changes of the present disclosure, these variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the appended claims.

What is claimed is:

1. An array substrate, comprising:
a base substrate;
a first conductive layer, provided on one side of the base substrate and comprising a first conductive portion;
a second conductive layer, provided on one side of the first conductive layer away from the base substrate and comprising a second conductive portion;
wherein a projection of at least part of the second conductive portion on the base substrate and a projection of the first conductive portion on the base substrate do not overlap;
wherein the first conductive portion is provided with an opening area, a projection of at least part of the second conductive portion on the base substrate being located in an area enclosed by a projection of the opening area;
wherein the second conductive portion at least comprises a first pad for mounting a light emitting device;
wherein the first pad is insulated from the first conductive layer in the opening area;
wherein at least part of the first conductive portion is configured to extend along a first direction, the opening area comprises a third opening area, and the third opening area comprises at least one third sub-opening area;
wherein the second conductive portion further comprises a second lead extending along a second direction, the second direction intersecting with the first direction;
wherein at least part of a projection of the second lead on the base substrate overlaps with an area enclosed by a projection of the third sub-opening area;
the first conductive layer further comprises a plurality of conductive islands, at least one of the third sub-opening area is provided with the conductive island, and there is a gap between an outer periphery of the conductive island and an edge of a corresponding third sub-opening area; and the plurality of conductive islands is insulated from both the first conductive portion and the second conductive portion.

2. The array substrate according to claim 1, wherein there is a gap between a projection edge of a portion of the second conductive portion corresponding to the opening area and a projection edge of the opening area.

3. The array substrate according to claim 2, wherein the opening area further comprises any one of a first opening area, a second opening area, and a fourth opening area.

4. The array substrate according to claim 3, wherein the opening area comprises the first opening area, the first opening area comprises a plurality of first sub-opening areas;

the second conductive portion comprises a plurality of groups of pads, each group of pads comprises a plurality of sub-pads;

at least part of projections of the sub-pads on the base substrate are located in areas enclosed by projections of the first sub-opening areas in a one-to-one correspondence, and there is a gap between an outer periphery of a projection of each of the sub-pads and a projection edge of a corresponding first sub-opening area; and the first sub-opening areas corresponding to the sub-pads of the same group of the pads are in communication with each other.

5. The array substrate according to claim 3, wherein at least part of the first conductive portion is configured to extend along the first direction, the opening area comprises a second opening area, and the second opening area comprises at least one second sub-opening area;

the second conductive portion comprises a first lead extending along the first direction;

at least part of a projection of the first lead on the base substrate overlaps an area enclosed by a projection of the second sub-opening area, and there is a gap between a projection edge of at least one side of the first lead and a projection edge of the second sub-opening area.

6. The array substrate according to claim 5, wherein there are a plurality of second sub-opening areas, and at least two of the second sub-opening areas are in communication with each other.

7. The array substrate according to claim 3, wherein there is a gap between edges on opposite sides of the second lead and a projection edge of the third sub-opening area.

8. The array substrate according to claim 7, wherein there are a plurality of third sub-opening areas, and at least two of the third sub-opening areas are in communication with each other.

9. The array substrate according to claim 3, wherein the second conductive portion further comprises a second pad for mounting an Integrated Circuit (IC) driver chip, and the second pad at least comprises a first input pad, a second input pad, an output pad, and a common voltage pad, wherein the first input pad is configured to receive a first input signal, the first input signal being an address signal for connecting to an IC driver chip with a corresponding address;

the second input pad is configured to receive a second input signal, the second input signal being a power line carrier communication signal from a source power line, and the second input signal being used for providing power to the IC driver chip and transmitting communication data to the IC driver chip;

the output pad is configured to output a driving signal, the driving signal being a driving voltage from a driving voltage line for driving a light-emitting element to emit light; and the common voltage pad is configured to receive a common voltage signal, the common voltage signal being a ground signal from a common voltage line.

10. The array substrate according to claim 2, wherein the opening area comprises a fourth opening area, the fourth opening area comprises at least one fourth sub-opening area;

the second conductive portion comprises several functional units;

a projection of each of the functional units on the base substrate is located in an area enclosed by a projection of each of the fourth sub-opening area in a one-to-one correspondence, and there is a gap between an outer periphery of a projection of each of the functional units and a projection edge of a corresponding fourth sub-opening area.

11. The array substrate according to claim 10, wherein there are a plurality of fourth sub-opening areas, and at least two of the fourth sub-opening areas are connected to each other.

12. The array substrate according to claim 11, wherein each of the functional units comprises a first test conductive portion electrically connected to the pad, the first lead or the second lead, the first test conductive portion is used to test electrical properties of the pad, the first lead or the second lead, wherein at least two of the first opening area, the second opening area, the third opening area, and the fourth opening area are in communication with each other.

13. The array substrate according to claim 12, wherein the second conductive portion comprises a plurality of groups of pads, each group of pads comprises a plurality of sub-pads;

a projection of at least one of the plurality of sub-pads, the first lead, the second lead and the first test conductive portion on the base substrate is located within a projection of a corresponding conductive island or completely overlaps with the projection of the corresponding conductive island.

14. The array substrate according to claim 13, wherein at least two of the sub-opening areas of one same opening area are in communication with each other, and the conductive islands in the sub-opening areas in communication with each other are independent of each other or connected as a whole.

15. The array substrate according to claim 13, wherein at least two of the first opening area, the second opening area, the third opening area, and the fourth opening area are connected to each other, the conductive islands in opening areas connected with each other are independent of each other or connected as a whole.

16. The array substrate according to claim 1, further comprising:

a first insulating layer and a first inorganic layer provided between the first conductive layer and the second conductive layer; and a second insulating layer and a second inorganic layer provided between the second conductive layer.

17. An array substrate, comprising:
a base substrate;
a first conductive layer, provided on one side of the base substrate and comprising a first conductive portion;

a second conductive layer, provided on one side of the first conductive layer away from the base substrate and comprising a second conductive portion;

wherein a projection of at least part of the second conductive portion on the base substrate and a projection of the first conductive portion on the base substrate do not overlap;

wherein the first conductive portion is provided with an opening area, a projection of at least part of the second conductive portion on the base substrate being located in an area enclosed by a projection of the opening area;

wherein the second conductive portion at least comprises a first pad for mounting a light emitting device;

wherein the first pad is insulated from the first conductive layer in the opening area;

wherein the second conductive portion further comprises a first lead, a projection of at least part of the first lead on the base substrate being not overlapped with a projection of the first conductive layer on the base substrate;

wherein a projection of the first lead on the first conductive layer does not overlap with the first conductive portion;

at least part of the first conductive portion is configured to extend along a first direction, the opening area comprises a third opening area, and the third opening area comprises at least one third sub-opening area;

the first conductive layer further comprises a plurality of conductive islands, at least one of the third sub-opening area is provided with the conductive island, and there is a gap between an outer periphery of the conductive island and an edge of a corresponding third sub-opening area; and the plurality of conductive islands is insulated from both the first conductive portion and the second conductive portion.

18. An array substrate, comprising:
a base substrate;
a first conductive layer, provided on one side of the base substrate and comprising a first conductive portion;
a second conductive layer, provided on one side of the first conductive layer away from the base substrate and comprising a second conductive portion;
wherein a projection of at least part of the second conductive portion on the base substrate and a projection of the first conductive portion on the base substrate do not overlap;
wherein the first conductive portion is provided with an opening area, a projection of at least part of the second conductive portion on the base substrate being located in an area enclosed by a projection of the opening area;
wherein the second conductive portion at least comprises a first pad for mounting a light emitting device;
wherein the first pad is insulated from the first conductive layer in the opening area;
wherein the first conductive layer has a thickness being larger than 1.5 μm;
wherein the first conductive layer comprises readily-oxidizable material;
at least part of the first conductive portion is configured to extend along a first direction, the opening area comprises a third opening area, and the third opening area comprises at least one third sub-opening area;
the first conductive layer further comprises a plurality of conductive islands, at least one of the third sub-opening area is provided with the conductive island, and there is a gap between an outer periphery of the conductive island and an edge of a corresponding third sub-opening area; and
the plurality of conductive islands is insulated from both the first conductive portion and the second conductive portion.

* * * * *